United States Patent
Kito et al.

(10) Patent No.: US 8,293,601 B2
(45) Date of Patent: Oct. 23, 2012

(54) METHOD OF MANUFACTURING A NON-VOLATILE SEMICONDUCTOR STORAGE DEVICE

(75) Inventors: Masaru Kito, Yokohama (JP); Ryota Katsumata, Yokohama (JP); Yoshiaki Fukuzumi, Yokohama (JP); Masaru Kidoh, Komae (JP); Hiroyasu Tanaka, Tokyo (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/010,466

(22) Filed: Jan. 20, 2011

(65) Prior Publication Data
US 2011/0111579 A1     May 12, 2011

Related U.S. Application Data

(62) Division of application No. 12/244,989, filed on Oct. 3, 2008, now Pat. No. 7,902,591.

(30) Foreign Application Priority Data
Oct. 5, 2007 (JP) ................................. 2007-262244

(51) Int. Cl.
*H01L 21/336* (2006.01)
(52) U.S. Cl. ................................. 438/268; 257/E21.667
(58) Field of Classification Search .................. 438/211, 438/257, 255, 258, 261, 263, 264, 267, 275, 438/276, 277, 278, 268
See application file for complete search history.

(56) References Cited

U.S. PATENT DOCUMENTS

| 5,599,724 | A | 2/1997 | Yoshida |
|---|---|---|---|
| 5,707,885 | A | 1/1998 | Lim |
| 2002/0195668 | A1 | 12/2002 | Endoh et al. |
| 2006/0020263 | A1 | 1/2006 | Rothstein et al. |
| 2006/0202263 | A1 | 9/2006 | Lee |
| 2007/0252201 | A1 | 11/2007 | Kito et al. |
| 2008/0067583 | A1 | 3/2008 | Kidoh et al. |
| 2008/0180994 | A1 | 7/2008 | Katsumata et al. |
| 2008/0186771 | A1 | 8/2008 | Katsumata et al. |

FOREIGN PATENT DOCUMENTS

| JP | 10-93088 | 4/1998 |
|---|---|---|
| JP | 10093083 | 4/1998 |
| KR | 10-0582516 | 5/2006 |
| KR | 10-2007009697 | 10/2007 |

OTHER PUBLICATIONS

Taiwanese Office Action issued Mar. 27, 2012, in Taiwan Patent Application No. 097138329 (with English Translation).
Korean Office Action issued Sep. 27, 2010, Application No. 10-2008-97119 (with English language translation).

*Primary Examiner* — Victor A Mandala
*Assistant Examiner* — Selim Ahmed
(74) *Attorney, Agent, or Firm* — Oblon, Spivak, McClelland, Maier & Neustadt, L.L.P.

(57) ABSTRACT

A non-volatile semiconductor storage device has a plurality of memory strings with a plurality of electrically rewritable memory cells connected in series. Each of the memory strings includes: a memory columnar semiconductor extending in a direction perpendicular to a substrate; a tunnel insulation layer contacting the memory columnar semiconductor; a charge accumulation layer contacting the tunnel insulation layer and accumulating charges; a block insulation layer contacting the charge accumulation layer; and a plurality of memory conductive layers contacting the block insulation layer. The lower portion of the charge accumulation layer is covered by the tunnel insulation layer and the block insulation layer.

13 Claims, 18 Drawing Sheets

METHOD OF MANUFACTURING A NON-VOLATILE SEMICONDUCTOR STORAGE DEVICE

CROSS-REFERENCE TO RELATED APPLICATIONS

This application is a division of and claims the benefit of priority under 35 U.S.C. §120 from U.S. Ser. No. 12/244,989 filed Oct. 3, 2008, and claims the benefit of priority under U.S.C. §119 from Japanese Patent Application No. 2007-262244 filed Oct. 5, 2007, the entire contents of each of which are incorporated herein by reference.

BACKGROUND OF THE INVENTION

1. Field of the Invention

The present invention relates to electrically rewritable semiconductor storage devices, and in particular to, among these, a non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled, for example. Accordingly, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2003-078044; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with a SGT (cylinder-type) structure (see, Patent Documents 1-3). Those semiconductor storage devices using transistors with a SGT (cylinder-type) structure are provided with multiple layers of polysilicon corresponding to gate electrodes and pillar-like columnar semiconductors that are formed to penetrate the multiple layers of polysilicon. Each of the columnar semiconductors serves as a channel (body) part of each of the transistors. A plurality of charge accumulation layers are provided around the columnar semiconductors via tunnel insulation layers for accumulating charges. Further, block insulation layers are formed around the charge accumulation layers. Such configurations including polysilicon, columnar semiconductors, tunnel insulation layers, charge accumulation layers, and block insulation layers are referred to as "memory string".

In the aforementioned conventional technology, columnar semiconductors are first formed, around which tunnel insulation layers, charge accumulation layers, block insulation layers, and gate electrodes are sequentially formed. Such way of formation, however, requires a large number of manufacturing steps and thus becomes cumbersome.

SUMMARY OF THE INVENTION

One aspect of the present invention provides a non-volatile semiconductor storage device comprising a plurality of memory strings with a plurality of electrically rewritable memory cells connected in series, wherein each of the memory strings comprising: a memory columnar semiconductor extending in a direction perpendicular to a substrate; a tunnel insulation layer contacting the memory columnar semiconductor; a charge accumulation layer contacting the tunnel insulation layer and accumulating charges; a block insulation layer contacting the charge accumulation layer; and a plurality of memory conductive layers contacting the block insulation layer, and wherein the lower portion of the charge accumulation layer is covered by the tunnel insulation layer and the block insulation layer.

In addition, another aspect of the present invention provides a non-volatile semiconductor storage device comprising a selection gate transistor controlling whether to conduct current, wherein the selection gate transistor comprising: a gate columnar semiconductor extending in a direction perpendicular to a substrate; a gate insulation layer contacting the gate columnar semiconductor; and a gate conductive layer contacting the gate insulation layer, and wherein a seam is formed in the gate insulation layers, from its upper end toward its lower end.

In addition, another aspect of the present invention provides a method of manufacturing a non-volatile semiconductor storage device having a plurality of memory strings with a plurality of electrically rewritable memory cells connected in series, the method comprising: alternately laminating first interlayer insulation layers and first conductive layers; forming a first hole penetrating the first interlayer insulation layers and the first conductive layers; sequentially forming a first insulation layer, a first sacrificial layer, and a first columnar semiconductor on the side surface of the first hole; removing the first sacrificial layer to form a first trench; forming a second insulation layer on the surface of the first columnar semiconductor exposed on the first trench; and forming a charge accumulation layer within the first trench, the charge accumulation layer accumulating charges.

DETAILED DESCRIPTION OF THE EMBODIMENTS

Embodiments of a non-volatile semiconductor storage device according to the present invention will now be described below with reference to the accompanying drawings.

[First Embodiment]
(Configuration of Non-Volatile Semiconductor Storage Device 100 in First Embodiment)

Figure 1:
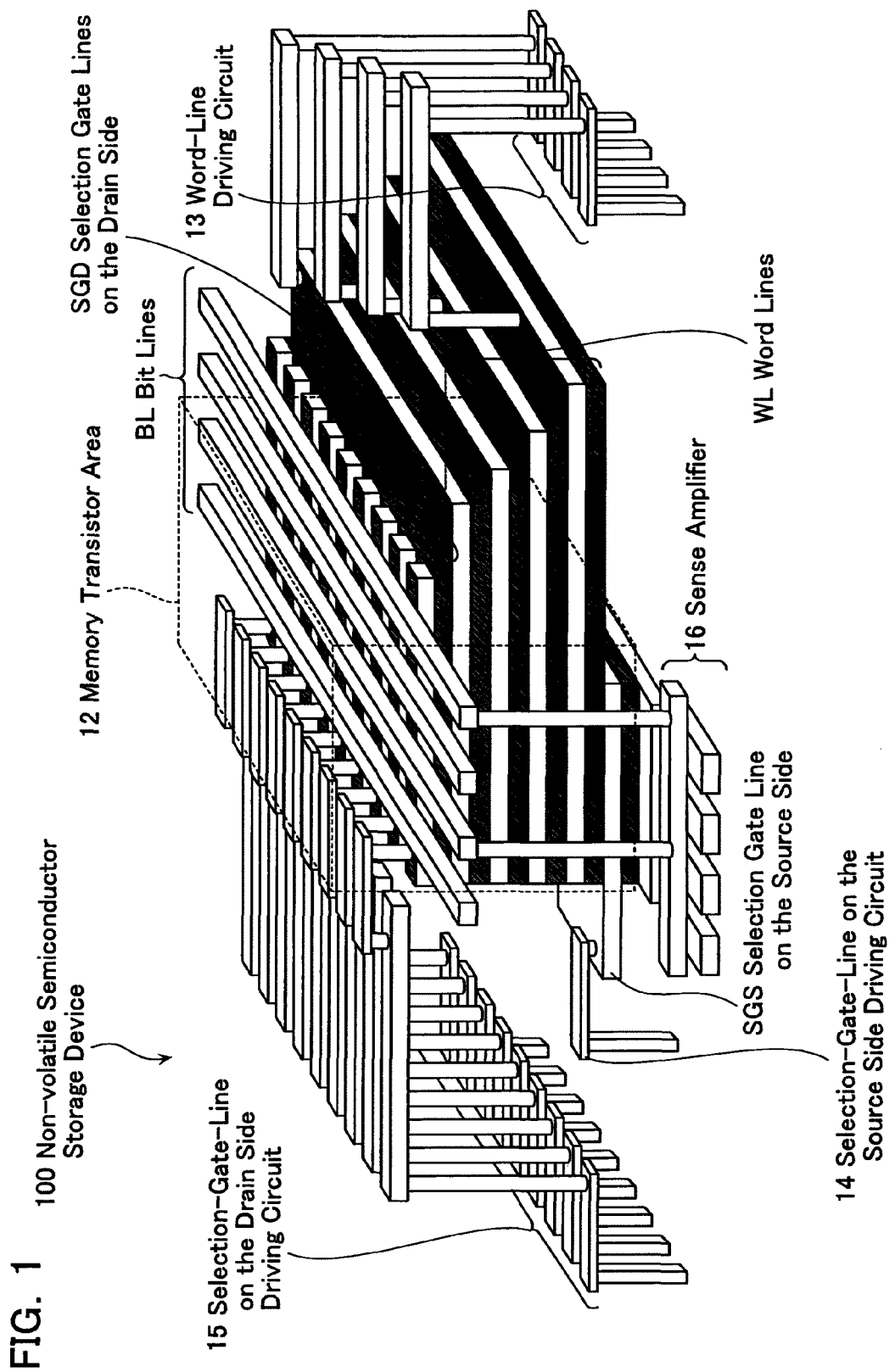
FIG. 1 is a schematic configuration diagram of a non-volatile semiconductor storage device according to a first embodiment of the present invention.

FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection-gate-line (SGS) driving circuit 14; a drain-side selection-gate-line (SGD) driving circuit 15; and a sense amplifier 16. The memory transistor area 12 has memory transistors for storing data. The word-line driving circuit 13 controls voltage applied to word lines WL. The source-side selection-gate-line (SGS) driving circuit 14 controls voltage applied to the source-side selection-gate-line SGS. The drain-side selection-gate-line (SGD) driving circuit 15 controls voltage applied to drain-side selection-gate-lines SGD. The sense amplifier 16 amplifies a potential read from a memory transistor. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors that configure the memory transistor area 12 are formed by lamination of a plurality of semiconductor layers. In addition, as illustrated in FIG. 1, a word line WL of each layer expands in a certain area in a two-dimensional manner. The word line WL of each layer has a planar structure of the same layer, respectively, providing a planar plate-like structure.

Figure 2:
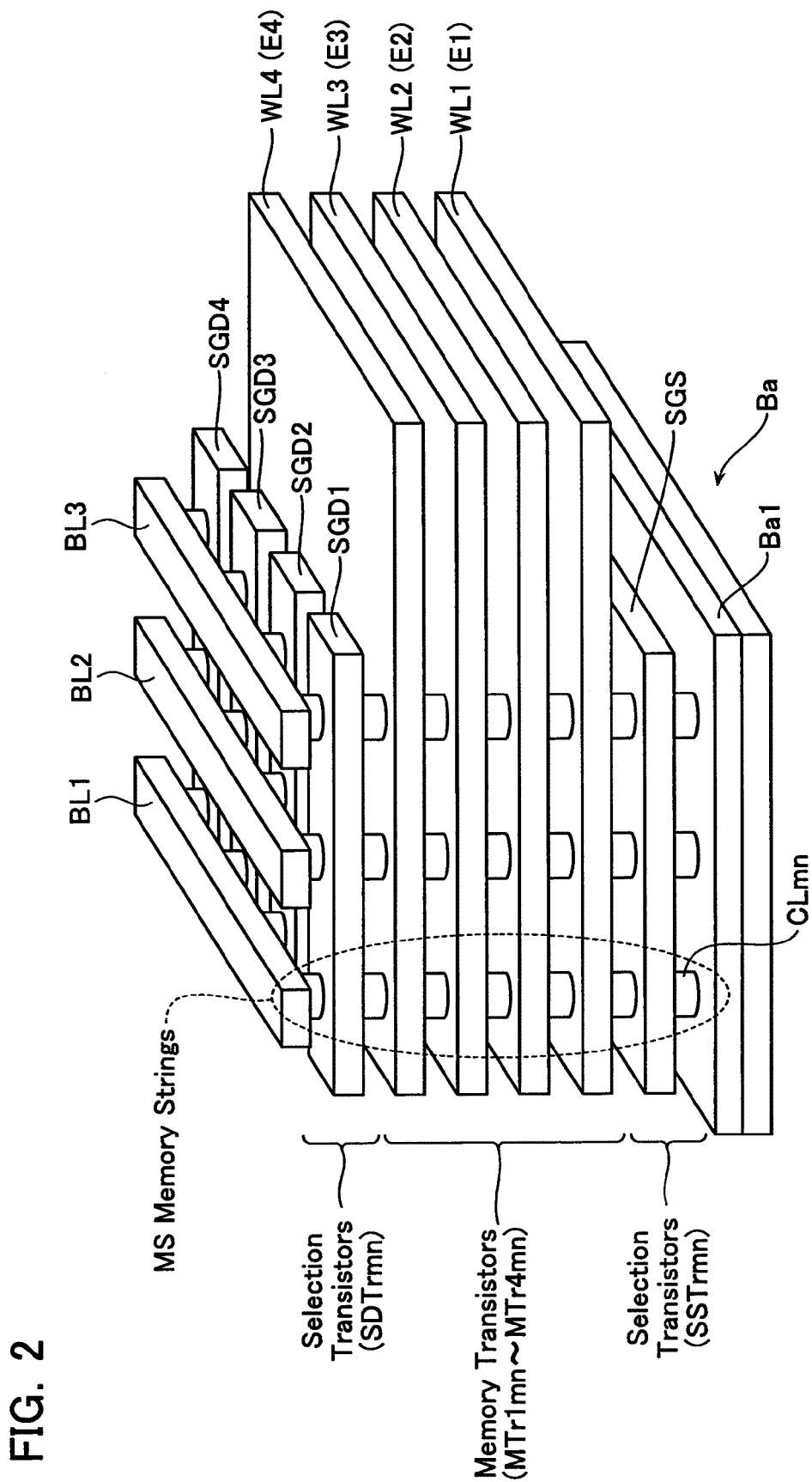
FIG. 2 is a perspective view schematically illustrating a part of the memory transistor area 12 in the non-volatile semiconductor storage device according to the first embodiment of the present invention.

FIG. 2 is a schematic configuration diagram illustrating a part of the memory transistor area 12 in the non-volatile semiconductor storage device 100 according to the first embodiment. According to the first embodiment, the memory transistor area 12 has m×n (m, n=natural number) memory strings MS including memory transistors (MTr1mn to MTr4mn) as well as selection transistors SSTrmn and SDTrmn. In FIG. 2, given that m=3, n=4.

In each of the memory strings MS, each of word lines (WL1 to WL4) connected to the gate of each of the memory transistors (MTr1mn to MTr4mn) is formed by the same conductive film and used in common therein. That is, in each of the memory strings MS, all gates of the memory transistor MTr1mn are connected to the word line WL1. In addition, in each of the memory strings MS, all gates of the memory transistor MTr2mn are connected to the word line WL2. In addition, in each of the memory strings MS, all gates of the memory transistor MTr3mn are connected to the word line WL3. In addition, in each of the memory strings MS, all gates of the memory transistor MTr4mn are connected to the word line WL4. As illustrated in FIGS. 1 and 2, in the non-volatile semiconductor storage device 100 according to the first embodiment, each of the word lines (WL1 to WL4) expands in a two-dimensional manner and has a planar plate-like structure. In addition, the word lines (WL1 to WL4) are arranged substantially perpendicular to the respective memory strings MS.

Each of the memory strings MS has columnar semiconductors CLmn (in the case of FIG. 2, m=1 to 3, n=1 to 4) provided on an N+ area formed on a P-well area Bal of a semiconductor substrate Ba. Each of the columnar semiconductors CLmn is formed in a direction perpendicular to the semiconductor substrate Ba and arranged in a matrix form on the surfaces of the semiconductor substrate Ba and the word lines (WL1 to WL4). That is, each of the memory strings MS is also arranged in a matrix form within a plane perpendicular to the corresponding columnar semiconductor CLmn. Besides, the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection-gate-lines SGD with rectangular plate shapes (in the case of FIG. 2, SGD1 to SGD4), which contact columnar semiconductors CLmn via insulating films (not illustrated) to configure respective drain-side selection-transistors SDTrmn. Unlike the word lines WL1 to WL4, the drain-side selection-gate-lines SGD are formed in parallel on the semiconductor substrate Ba in a stripe form, insulated and isolated from each other at intervals with a predetermined pitch. In addition, provided at the center in the width direction of the drain-side selection-gate-lines SGD are columnar semiconductors CLmn, each of which is formed to penetrate that center.

Further, as illustrated in FIG. 2, provided on the lower portions of the memory strings MS is a source-side selection-gate-line SGS, which contact the columnar semiconductors CLmn via insulating films (not illustrated) to configure respective source-side selection-transistors SSTrmn. The source-side selection-gate-line SGS has a planar plate-like structure that expands in a two-dimensional manner as the word lines WL1 to WL4.

Figure 3:
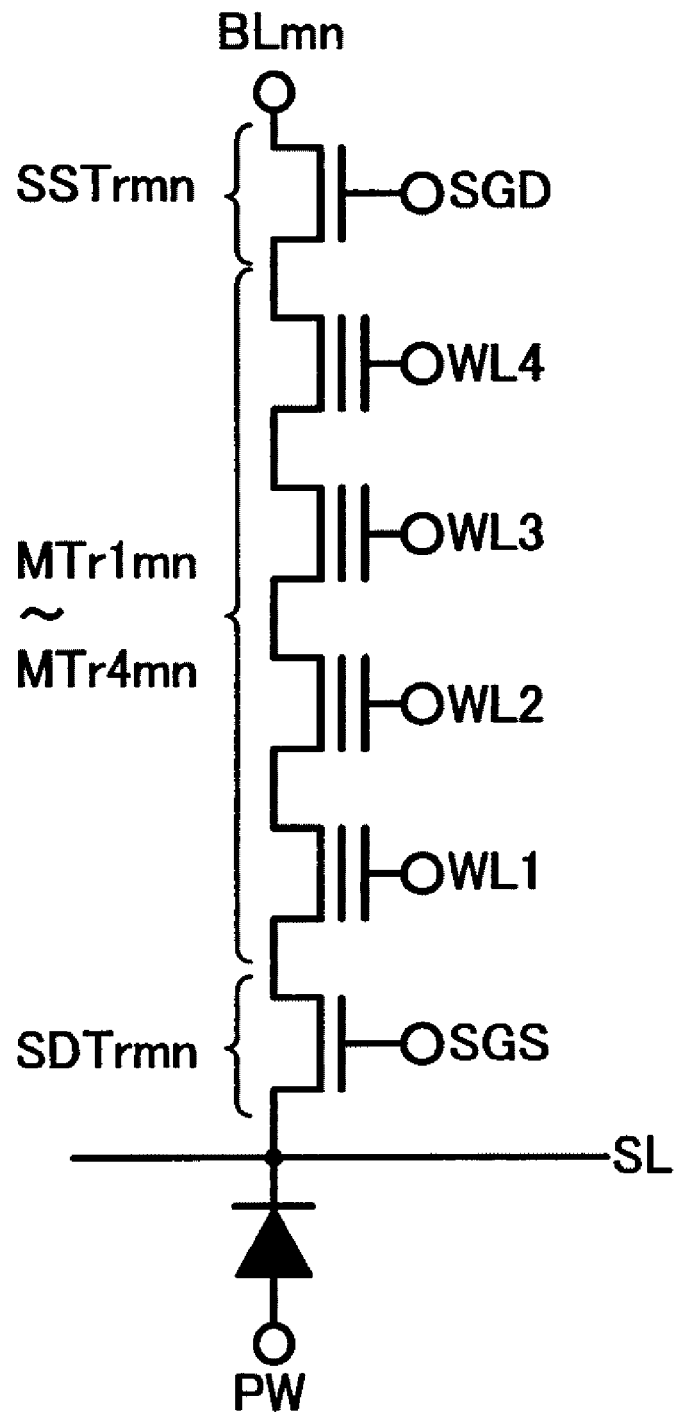
FIG. 3 is a circuit diagram illustrating one of the memory strings MS according to the first embodiment of the present invention.

Referring now to FIGS. 2 and 3, the circuit configuration and operation of the memory strings MS of the first embodiment will be described below. FIG. 3 is a circuit diagram illustrating one of the memory strings MS according to the first embodiment.

As illustrated in FIGS. 2 and 3, in the first embodiment, each of the memory strings MS has four memory transistors MTr1mn to MTr4mn as well as two selection transistors SSTrmn and SDTrmn. These four memory transistors MTr1mn to MTr4mn as well as the source-side selection-transistor SSTrmn and the drain-side selection-transistor SDTrmn are connected in series to each other (see FIG. 3). According to the first embodiment, in each of the memory strings MS, a columnar semiconductor CLmn is formed on an N+ area that is formed in a P– type area (P-well area) Ba1 on the semiconductor substrate Ba.

In addition, a source line SL (an N+ area formed in the P-well area Ba1 on the semiconductor substrate Ba) is connected to the source of each selection transistor SSTrmn. Further, bit lines BL are connected to the drains of the selection transistors SDTrmn.

Each of the memory transistors MTrmn is configured by a columnar semiconductor CLmn, a charge accumulation layer surrounding a corresponding columnar semiconductor CLmn and surrounded by an insulating film, and a word line WL surrounding the charge accumulation layer. One end of each word line WL contacts a respective charge accumulation layer via the insulating film functions as a control gate electrode CG of each memory transistor MTrmn. The sources and drains of the memory transistors MTrmn are formed at the columnar semiconductors CLmn.

In the non-volatile semiconductor storage device 100 with the above-mentioned configuration, respective voltages of the bit lines BL1 to BL3, the drain-side selection-gate-lines SGD, the word lines WL1 to WL4, the source-side selection-gate-line SGS, and the source lines SL are controlled by bit-line driving circuits (not illustrated), the drain-side selection-gate-line driving circuit 15, the word line driving circuits 13, the source-side selection-gate-line driving circuit 14, and a source line driving circuit (not illustrated). That is, data is read, written and erased by controlling charges of the charge accumulation layer in a predetermined memory transistor MTrmn.

(Specific Configuration of Memory Strings MS in First Embodiment)

Figure 4:
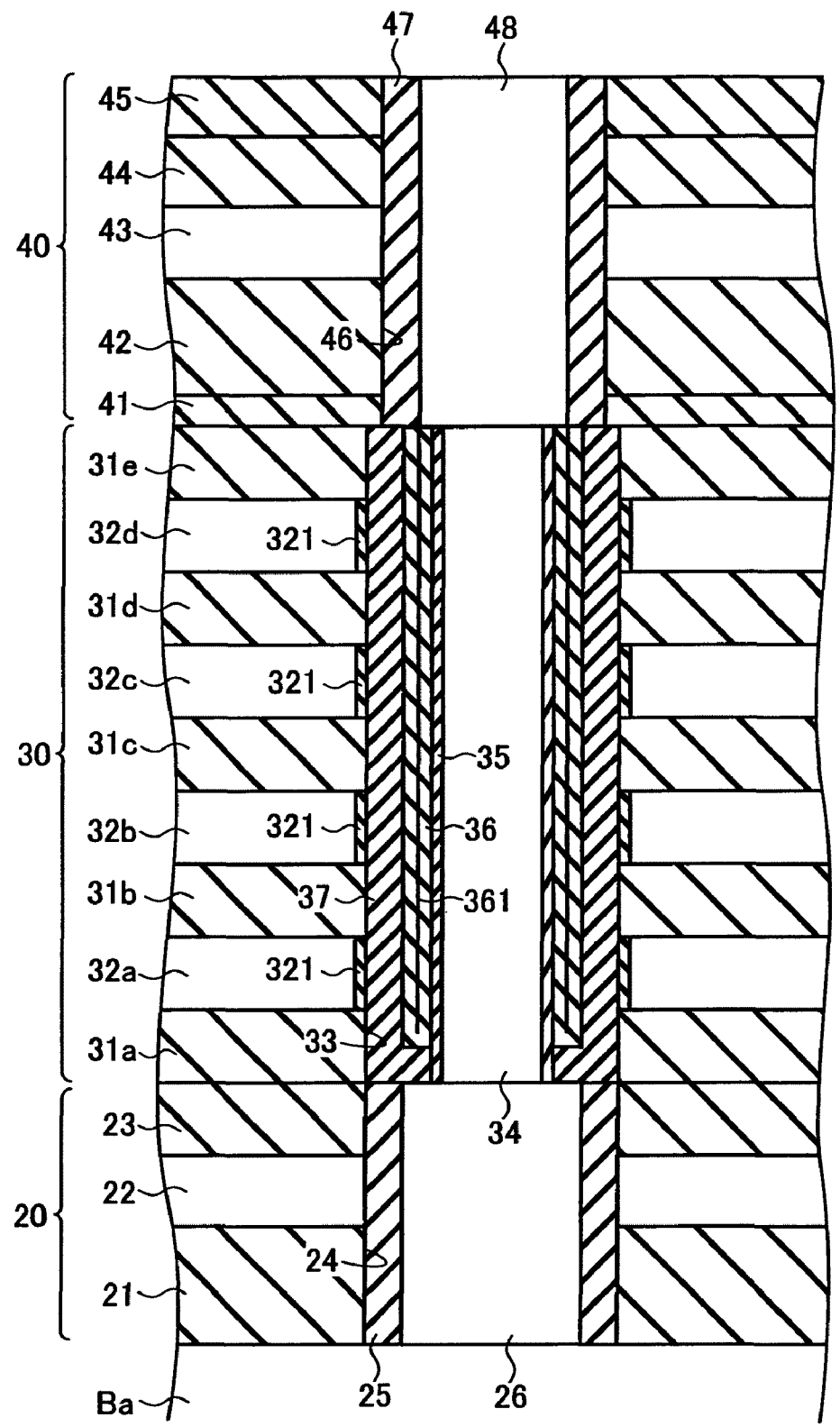
FIG. 4 is a diagram illustrating a cross-sectional structure of one of the memory strings MS according to the first embodiment.

Referring now to FIG. 4, a further specific configuration of the memory strings MS will be described below. FIG. 4 is a diagram illustrating a cross-sectional structure of one of the memory strings MS according to the first embodiment. As illustrated in FIG. 4, each of the memory strings MS has, from lower layer to upper layer, a source-side selection transistor layer 20, a memory transistor layer 30, and a drain-side selection transistor layer 40. The source-side selection transistor layer 20 functions as a source-side selection-transistor SSTrmn. The memory transistor layer 30 functions as a memory transistor MTrmn. The selection drain-side transistor layer 40 functions as a drain-side selection-transistor SDTrmn.

The source-side selection transistor layer 20 has a source-side first insulation layer 21 formed on the semiconductor substrate Ba, a source-side conductive layer (gate conductive layer) 22 formed on the top surface of the source-side first insulation layer 21, and a source-side second insulation layer 23 formed on the top surface of the source-side conductive layer 22. The source-side first insulation layer 21 and the source-side second insulation layer 23 are composed of, e.g., silicon oxide. In addition, the source-side conductive layer 22 is composed of, e.g., polysilicon. Note that one end of the source-side conductive layer 22 functions as a control gate of the selection transistor SSTrmn.

In addition, the source-side selection transistor layer 20 has a source-side hole 24 that is formed to penetrate the source-side first insulation layer 21, the source-side conductive layer 22, and the source-side second insulation layer 23. The source-side hole 24 has a source-side columnar semiconductor layer (gate columnar semiconductor) 26 provided therein via a source-side gate insulation layer 25. The source-side gate insulation layer 25 is formed by HTO. The source-side columnar semiconductor layer 26 is formed by amorphous silicon. Note that HTO is an oxide film TEOS based on high temperature deposition.

The memory transistor layer 30 has first to fifth insulation layers between word lines 31a to 31e that are provided over the source-side second insulation layer 23, and first to fourth word-line conductive layers 32a to 32d that are provided one above the other with the first to fifth insulation layers between word lines 31a to 31e, respectively. For example, the first to fifth insulation layers between word lines 31a to 31e is composed of, e.g., silicon oxide. In addition, the first to fourth word-line conductive layers 32a to 32d is composed of, e.g., polysilicon. The first to fourth word-line conductive layers 32a to 32d function as the above-mentioned word lines WL1 to WL4.

In addition, the memory transistor layer 30 has a memory hole 33 that is formed to penetrate the first to fifth insulation layers between word lines 31a to 31e and the first to fourth word-line conductive layers 32a to 32d, and a memory columnar semiconductor layer 34 that is formed within the memory hole 33. The memory columnar semiconductor layer 34 is formed by amorphous silicon.

The memory transistor layer 30 further has a tunnel insulation layer 35 that contacts the memory columnar semiconductor layer 34, a charge accumulation layer 36 that contacts the tunnel insulation layer 35 and accumulates charges, and a block insulation layer 37 that contacts the charge accumulation layer 36. The block insulation layer 37 contacts the first to fourth word line conductive layers (memory conductive layers) 32a to 32d. In addition, oxidation layers 321 are formed on the side surfaces of the first to fourth word-line conductive layers 32a to 32d that contact the block insulation layer 37. The tunnel insulation layer 35 is formed by silicon oxide. The charge accumulation layer 36 is formed by silicon nitride (SiN). The block insulation layer 37 is formed by HTO.

The tunnel insulation layer 35 is formed between the side surface of the memory columnar semiconductor layer 34 and the side surface of the charge accumulation layer 36. In addition, the tunnel insulation layer 35 is formed between a part of the top surface of the source-side columnar semiconductor layer 26 and the bottom surface of the charge accumulation layer 36.

The bottom portion of the charge accumulation layer 36 is covered by the tunnel insulation layer 35 and the block insulation layer 37. In addition, the charge accumulation layer 36 has a seam 361 from its upper end toward its lower end. The seam 361 is formed with a certain depth, not reaching the bottom of the charge accumulation layer 36. Such a seam as 361 is produced when the block insulation layer 37 and the memory columnar semiconductor layer 34 are formed before forming the charge accumulation layer 36, as will be later discussed.

The drain-side selection transistor layer 40 has a first isolation/insulation layer 41 that is formed on the fifth insulation layer between word lines 31e, a drain-side first insulation layer 42 that is formed on the top surface of the first isolation/insulation layer 41, a drain-side conductive layer (gate conductive layer) 43 that is formed on the top surface of the drain-side first insulation layer 42, a drain-side second insulation layer 44 that is formed on the top surface of the drain-side conductive layer 43, and a second isolation and insulation layer 45 that is formed on the top surface of the drain-side second insulation layer 44. The first isolation/insulation layer 41 and the second isolation and insulation layer 45 are formed by silicon nitride. The drain-side first insulation layer 42 and the drain-side second insulation layer 44 are formed by silicon oxide. The drain-side conductive layer 43 is formed by polysilicon. Note that one end of the drain-side conductive layer 43 functions as a control gate of the selection transistors SDTrmn.

In addition, the drain-side selection transistor layer 40 has a drain-side hole 46 that is formed to penetrate the first isolation/insulation layer 41, the drain-side first insulation layer 42, the drain-side conductive layer 43, the drain-side second insulation layer 44, and the second isolation and insulation layer 45. The drain-side hole 46 has a drain-side columnar semiconductor layer (gate columnar semiconductor) 48 provided therein via a drain-side gate insulation layer 47. The drain-side gate insulation layer 47 is formed by HTO. The drain-side columnar semiconductor layer 48 is formed by amorphous silicon.

(First Manufacturing Process of Memory Strings MS in First Embodiment)

Referring now to FIGS. 5 through 10, a first manufacturing process of the memory strings MS according to the first embodiment will be described below. Note that some of the first to fifth insulation layers between word lines 31a to 31e and some of the first to fourth word-line conductive layers 32a to 32d are omitted from FIGS. 5 through 10.

Figure 5:
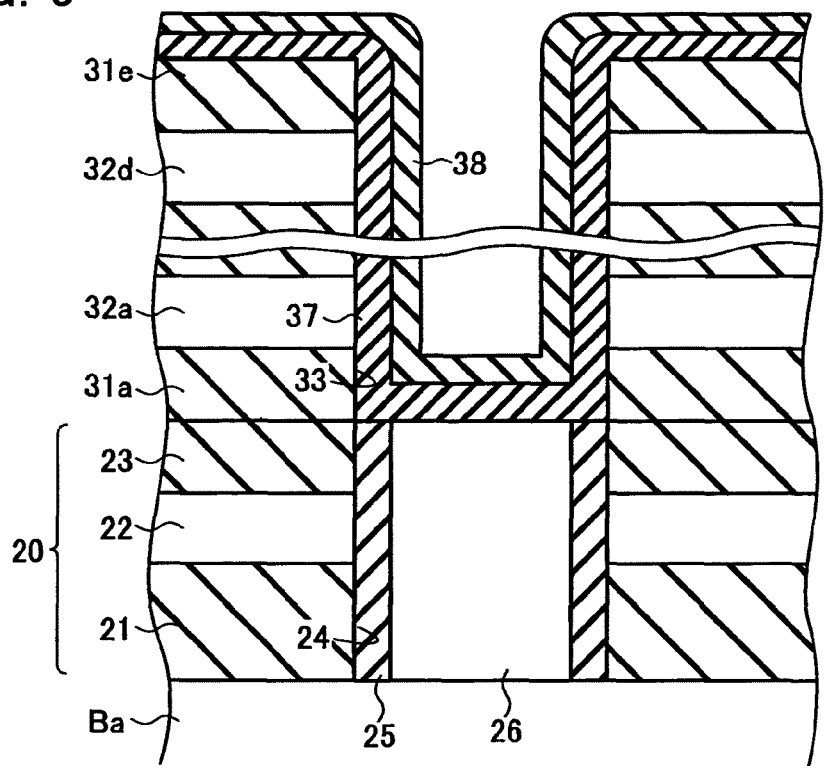
FIG. 5 is a cross-sectional view of one of the memory strings MS in a first manufacturing process according to the first embodiment.

Firstly, a source-side selection transistor layer 20 is formed on the substrate Ba. Secondly, amorphous silicon and silicon oxide are alternately laminated over the source-side selection transistor layer 20 to form first to fifth insulation layers between word lines 31a to 31e and first to fourth word-line conductive layers 32a to 32d. Thirdly, a memory hole 33 is formed to penetrate the first to fifth insulation layers between word lines 31a to 31e and the first to fourth word-line conductive layers 32a to 32d. Thereafter, a block insulation layer 37 and a sacrificial layer 38 are sequentially deposited within the memory hole 33. The resulting state of this process is depicted in FIG. 5. Note that the sacrificial layer 38 is composed of silicon germanium (SiGe).

Figure 6:
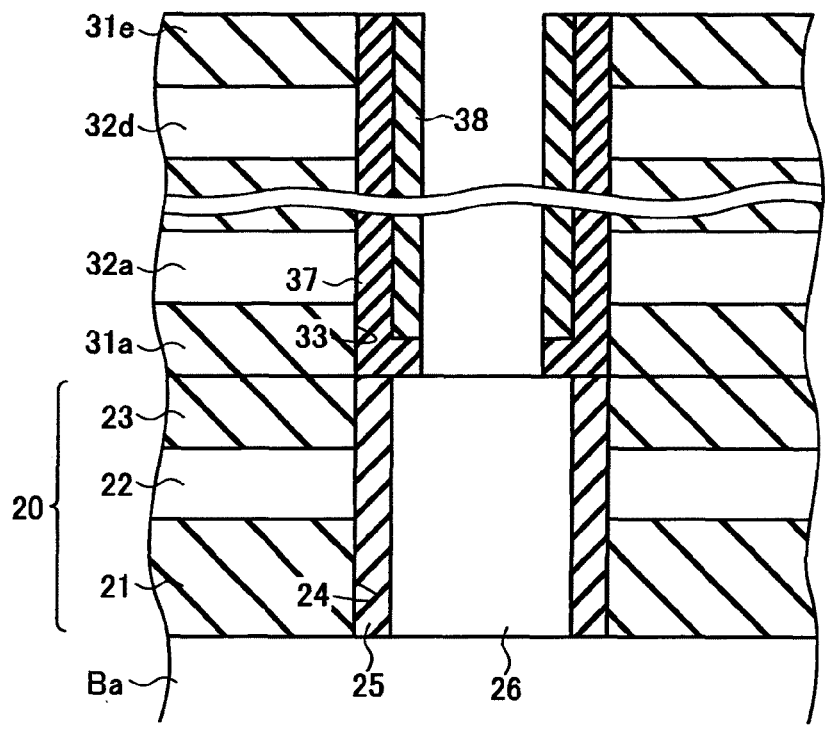
FIG. 6 is a cross-sectional view of one of the memory strings MS in the first manufacturing process according to the first embodiment.

Then, those portions of the block insulation layer 37 and the sacrificial layer 38 are removed that are located at the upper portion of the bottom surface of the memory hole 33 and the top surface of the fifth insulation layer between word lines 31e, and the process is advanced to a state as illustrated in FIG. 6. Further, hydrofluoric acid treatment is performed to remove any natural oxide film that is formed on the top surface of the source-side columnar semiconductor layer 26 exposed on the bottom surface of the memory hole 33.

Figure 7:
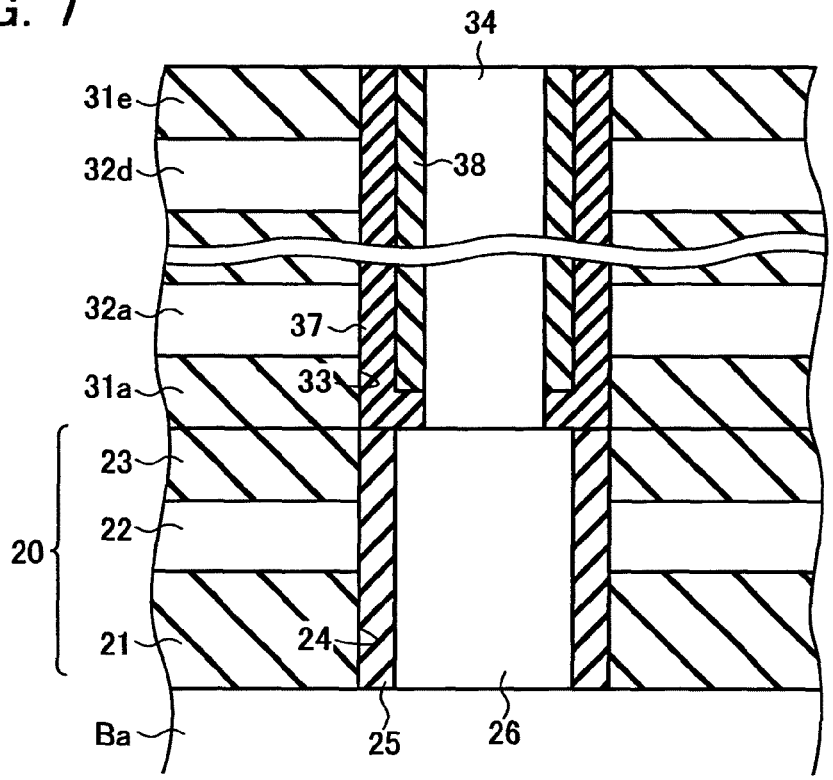
FIG. 7 is a cross-sectional view of one of the memory strings MS in the first manufacturing process according to the first embodiment.

Then, as illustrated in FIG. 7, amorphous silicon is deposited in such a way that it comes in contact with the side surface of the sacrificial layer 38 within the memory hole 33, thereby forming a memory columnar semiconductor layer 34.

Figure 8:
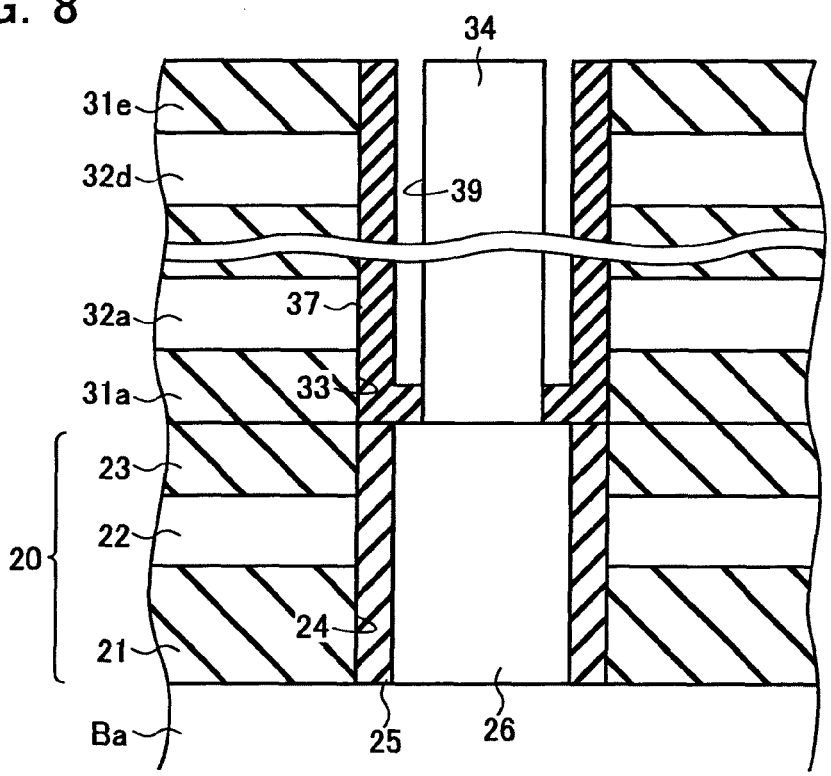
FIG. 8 is a cross-sectional view of one of the memory strings MS in the first manufacturing process according to the first embodiment.

Then, as illustrated in FIG. 8, the sacrificial layer 38 is removed by selective etching. Note that etching is performed in, e.g., a $ClF_3$ vapor atmosphere since the sacrificial layer 38 is of silicon germanium. Through this process, removing the sacrificial layer 38 by selective etching provides a hollow cylindrical trench 39 formed between the memory columnar semiconductor layer 34 and the block insulation layer 37.

Figure 9:
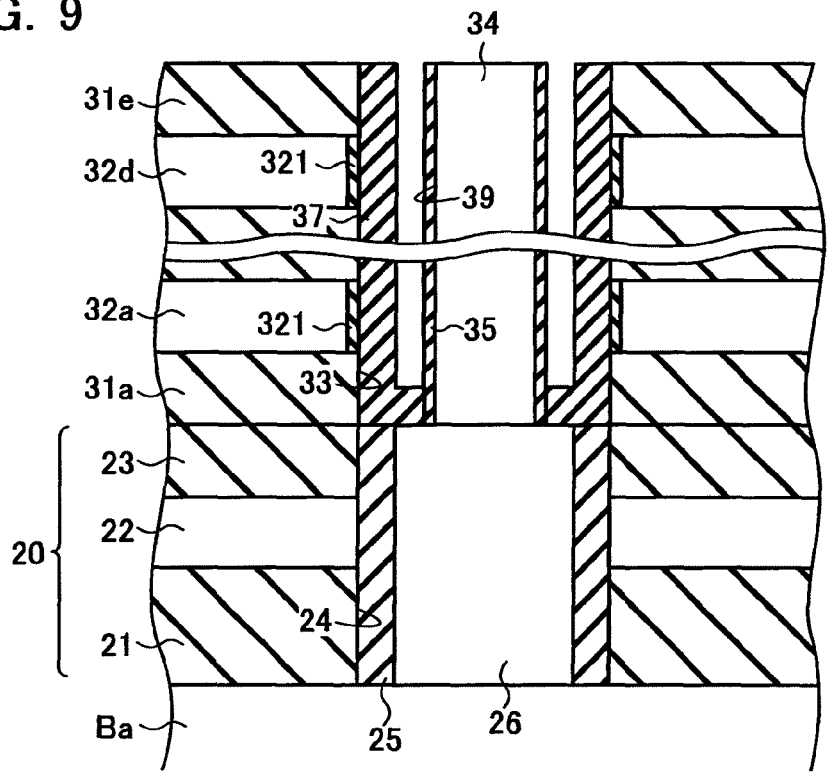
FIG. 9 is a cross-sectional view of one of the memory strings MS in the first manufacturing process according to the first embodiment.

Then, as illustrated in FIG. 9, the memory columnar semiconductor layer 34 within the trench is oxidized by ISSG, thereby forming a tunnel insulation layer 35 of silicon oxide on the side surface of the memory columnar semiconductor layer 34. In addition, at the process of FIG. 9, the oxidation layers 321 are formed on the side surfaces of the first to fourth word-line conductive layers 32a to 32d that contact the block insulation layer 37. Note that the process of FIG. 9 may be ALD (atomic layer deposition) rather than the ISSG oxidation.

Figure 10:
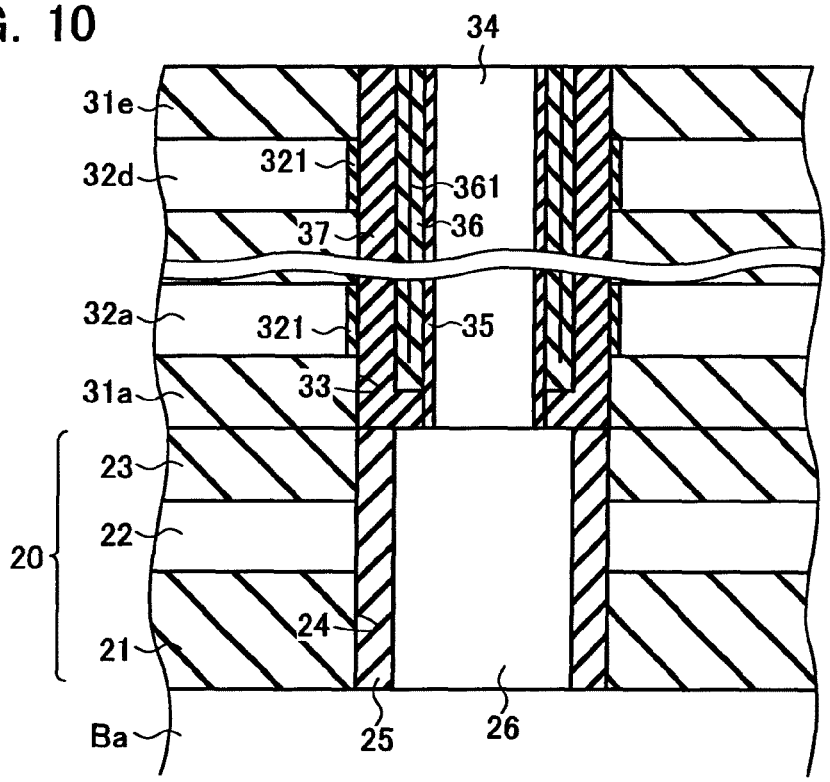
FIG. 10 is a cross-sectional view of one of the memory strings MS in the first manufacturing process according to the first embodiment.

Then, as illustrated in FIG. 10, silicon nitride is deposited in such a way that is comes in contact with the tunnel insulation layer 35 and the block insulation layer 37 within the trench, thereby forming a charge accumulation layer 36. Through this process, the bottom portion of the charge accumulation layer 36 is covered by the tunnel insulation layer 35 and the block insulation layer 37. In addition, a seam 361 is formed in the charge accumulation layer 36. Subsequently, a drain-side selection transistor layer 40 is formed and the non-volatile semiconductor storage device 100 as illustrated in FIG. 4 is manufactured.

(Second Manufacturing Process of Memory Strings MS in First Embodiment)

Figure 11:
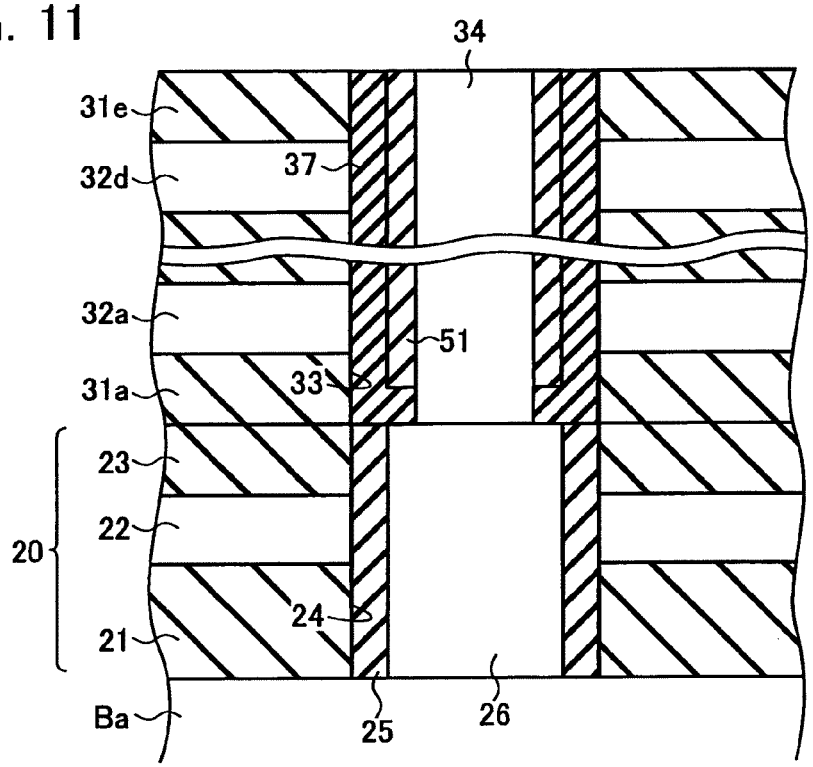
FIG. 11 is a cross-sectional view of one of the memory strings MS in a second manufacturing process according to the first embodiment.
Figure 12:
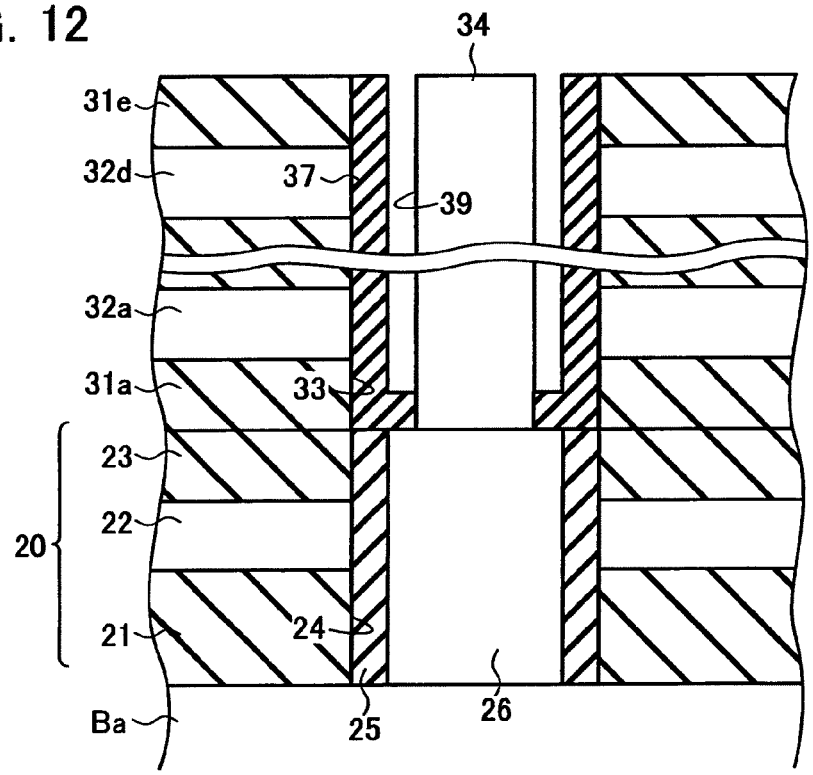
FIG. 12 is a cross-sectional view of one of the memory strings MS in the second manufacturing process according to the first embodiment.

Referring now to FIGS. 11 and 12, a second manufacturing process of the memory strings MS according to the first embodiment will be described below. Note that some of the first to fifth insulation layers between word lines 31a to 31e and some of the first to fourth word-line conductive layers 32a to 32d are omitted from FIGS. 11 and 12.

In the second manufacturing process, through the substantially the same process as that illustrated in FIGS. 5 and 6 in the first manufacturing process, a sacrificial layer 51 of silicon nitride is deposited instead of the sacrificial layer 38 used in the first manufacturing process, forming the state illustrated in FIG. 11.

Then, as illustrated in FIG. 12, the sacrificial layer 51 is removed by elective etching. Etching is performed by Hot phosphoric acid, etc, since the sacrificial layer 51 is of silicon nitride. Subsequently, through the process similar to that described in the first manufacturing process (FIGS. 9 and 10), the non-volatile semiconductor storage device 100 is manufactured as illustrated in FIG. 4.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing processes of the non-volatile semiconductor storage device 100, each layer corresponding to a respective memory transistor MTrmn and the selection transistors SST and SDT may be manufactured in a predetermined number of lithography steps, irrespective of the number of laminated layers. That is, the non-volatile semiconductor storage device 100 maybe manufactured at a lower cost.

Now considering that memory strings are formed using a different manufacturing method from the first manufacturing process of the present invention. For example, given that this different manufacturing method includes the following steps: sequentially depositing a block insulation layer, a charge accumulation layer, and a tunnel insulation layer on the surface of a hole, removing those portions of the tunnel insulation layer, the charge accumulation layer, and the block insulation layer that are located at the bottom surface of the hole, removing any natural oxide film on the semiconductor surface exposed on the bottom surface of the hole, depositing polysilicon within the hole, and forming a columnar semiconductor.

However, in the different manufacturing method, the tunnel insulation layer, etc., that is formed on the sidewall of the hole is also removed by the hydrofluoric acid treatment used in removing any natural oxide film on the semiconductor surface. In addition, the different manufacturing method may pose other problems, such as reduction in operational margin due to the threshold variations caused by charge trapping (charge accumulation) to the charge accumulation layer, if the tunnel insulation layer is composed of material other than oxide film to eliminate these problems with the hydrofluoric acid treatment. Further, even if the tunnel insulation layer is formed by an oxide film using some method (such as a spacer process), problems may arise in such a deposition type film based on LP-CVD process, etc., leading to degraded reliability such as degradation in breakdown voltage, TDDB (Time-Dependent Dielectric Breakdown) characteristics and so on.

On the contrary, the non-volatile semiconductor storage device 100 according to the first embodiment of the present invention is manufactured through the step of forming the charge accumulation layer 36 within the trench 39 formed between the memory columnar semiconductor layer 34 and the block insulation layer 37. Note that, through the above-mentioned step, the lower portion of the charge accumulation layer 36 is covered by the tunnel insulation layer 35 and the block insulation layer 37. In addition, through the above-mentioned step, the seam 361 is formed in the charge accumulation layer 36.

Accordingly, in the first embodiment of the present invention, hydrofluoric acid treatment is performed with the block insulation layer 37 protected by the sacrificial layer 38. Then, the sacrificial layer 38 is removed and the tunnel insulation layer 35 and the charge accumulation layer 36 are formed within the trench 39. This means that the non-volatile semiconductor storage device 100 can suppress degraded reliability problems, such as degradation in breakdown voltage caused in the different manufacturing method, because it may form the tunnel insulation layer 35, the charge accumulation layer 36, and the block insulation layer 37 with a preset, predetermined film thickness, respectively, without being affected by the hydrofluoric acid treatment.

[Second Embodiment]

(Specific Configuration of Memory Strings MS in Second Embodiment)

Figure 13:
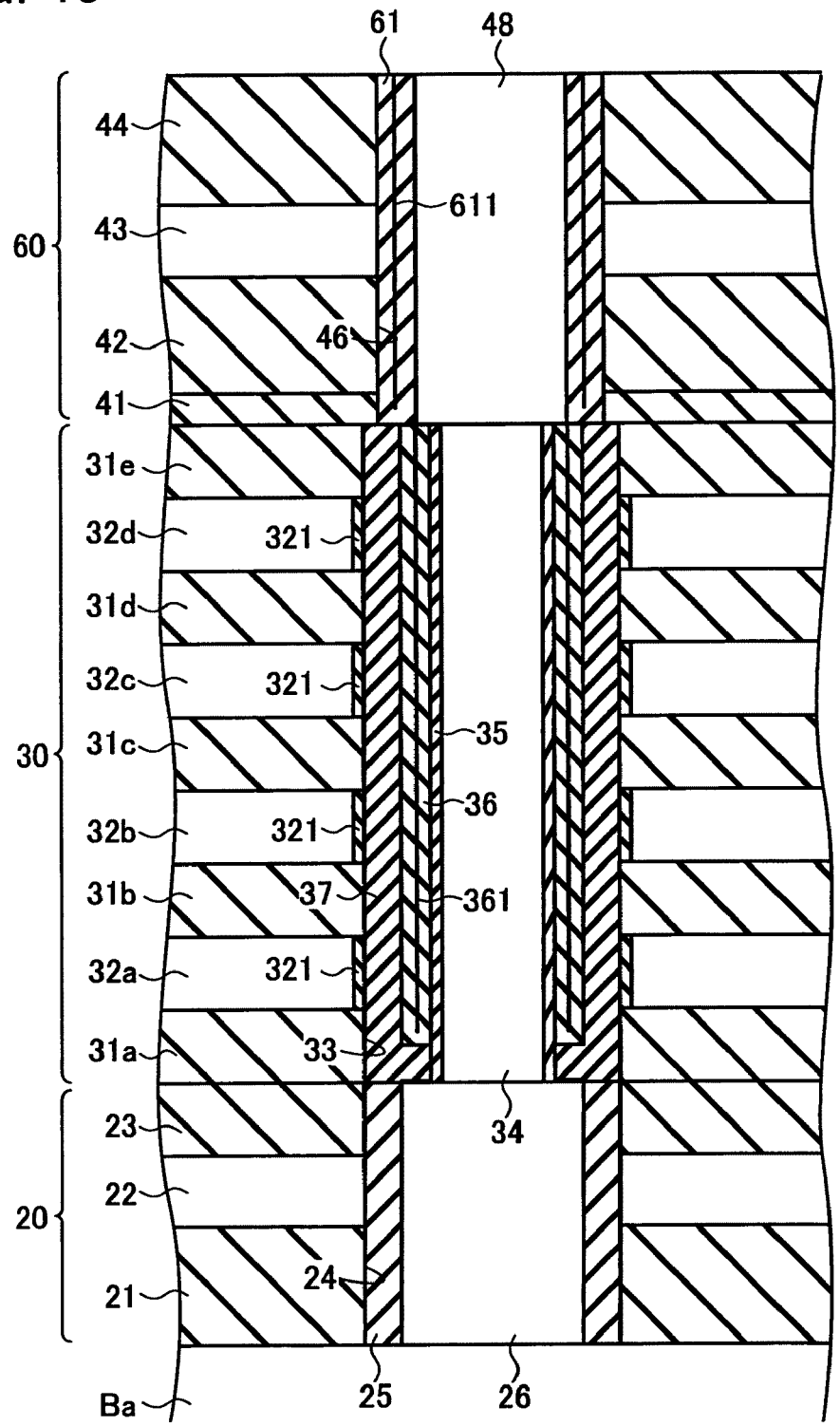
FIG. 13 is a diagram illustrating a cross-sectional structure of one of the memory strings MS according to a second embodiment.

Referring now to FIG. 13, a specific configuration of memory strings MS in a non-volatile semiconductor storage device according to a second embodiment of the present invention will be described below. As illustrated in FIG. 13, the non-volatile semiconductor storage device according to the second embodiment a drain-side selection transistor layer 60 different from the first embodiment. Besides, the same reference numerals represent the same components as the first embodiment and description thereof will be omitted in the second embodiment.

As illustrated in FIG. 13, the drain-side selection transistor layer 60 in each of the memory strings MS according to the second embodiment has a configuration similar to the first embodiment, except the second isolation and insulation layer 45 is omitted. In addition, the drain-side selection transistor layer 60 has a drain-side gate insulation layer 61 with a different shape from than that of the first embodiment.

The drain-side gate insulation layer 61 has a seam 611 from its upper end toward its lower end. The seam 611 is formed with a certain depth, not reaching the bottom of the drain-side gate insulation layer 61. Such a seam as 611 is produced when the drain-side columnar semiconductor layer 48 is formed before forming the drain-side gate insulation layer 61, as will be later discussed. The drain-side gate insulation layer 61 is formed by HTO.

(Manufacturing Process of Memory Strings MS in Second Embodiment)

Referring now to FIGS. 14 through 17, the manufacturing process of the memory strings MS according to the second embodiment will be described below. Note that some of the first to fifth insulation layers between word lines 31a to 31e and some of the first to fourth word-line conductive layers 32a to 32d are omitted from FIGS. 14 through 17.

Figure 14:
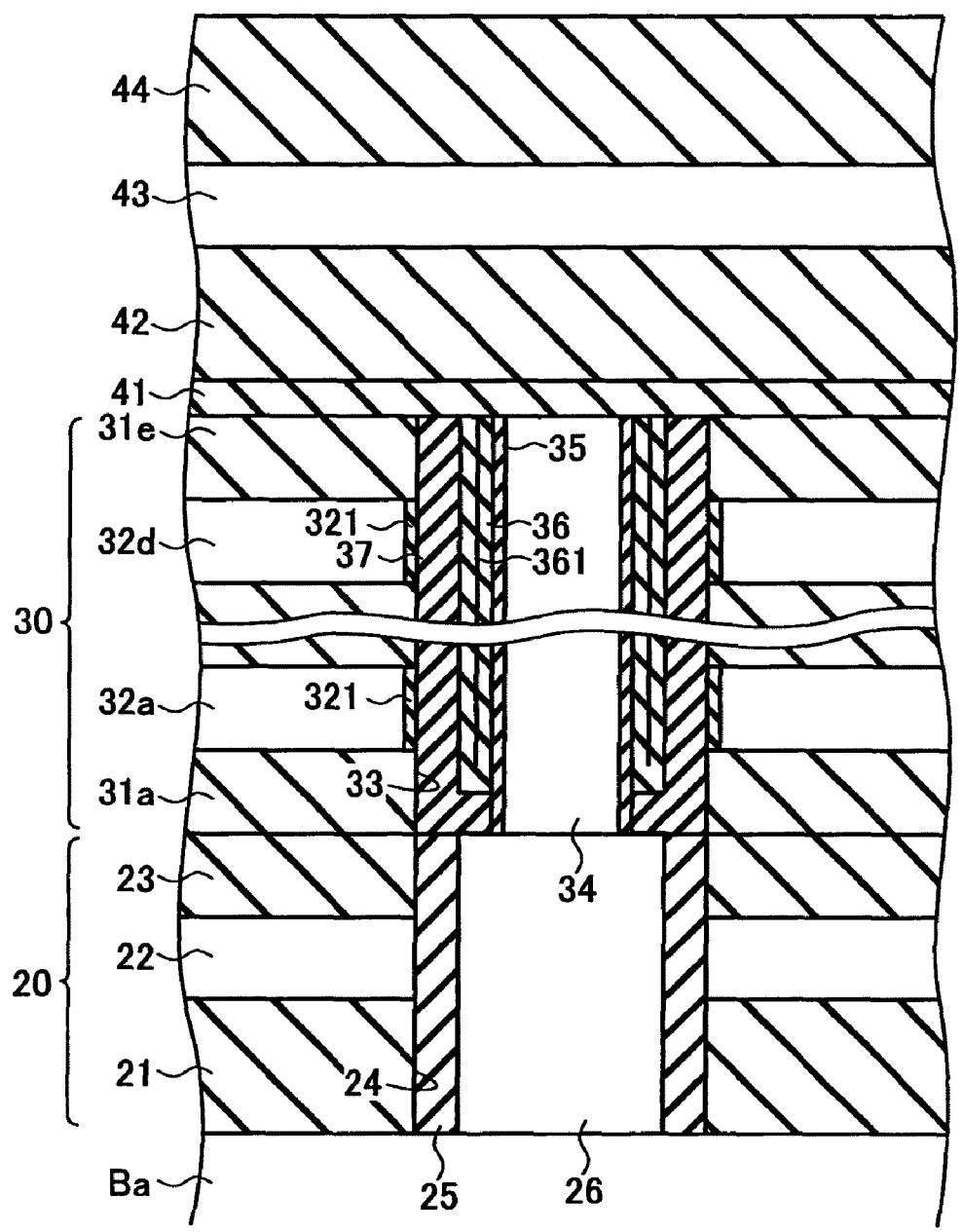
FIG. 14 is a cross-sectional view of one of the memory strings MS in a manufacturing process according to the second embodiment.

Firstly, a source-side selection transistor layer 20 is formed on the substrate Ba. Secondly, a memory transistor layer 30 is deposited on the source-side selection transistor layer 20 through the same manufacturing process as the first embodiment. Thereafter, a silicon nitride layer, a silicon oxide film, polysilicon, and a silicon oxide film are sequentially deposited on the fifth insulation layer between word lines 31e to form a first isolation/insulation layer 41, a drain-side first insulation layer 42, a drain-side conductive layer 43, and a drain-side second insulation layer 44. The resulting state is depicted in FIG. 14. That is, in the process of FIG. 14, a first isolation/insulation layer 41, a drain-side first insulation layer 42, a drain-side conductive layer 43, and a drain-side second insulation layer 44 are laminated in order on the top surface of the memory columnar semiconductor layer 34.

Figure 15:
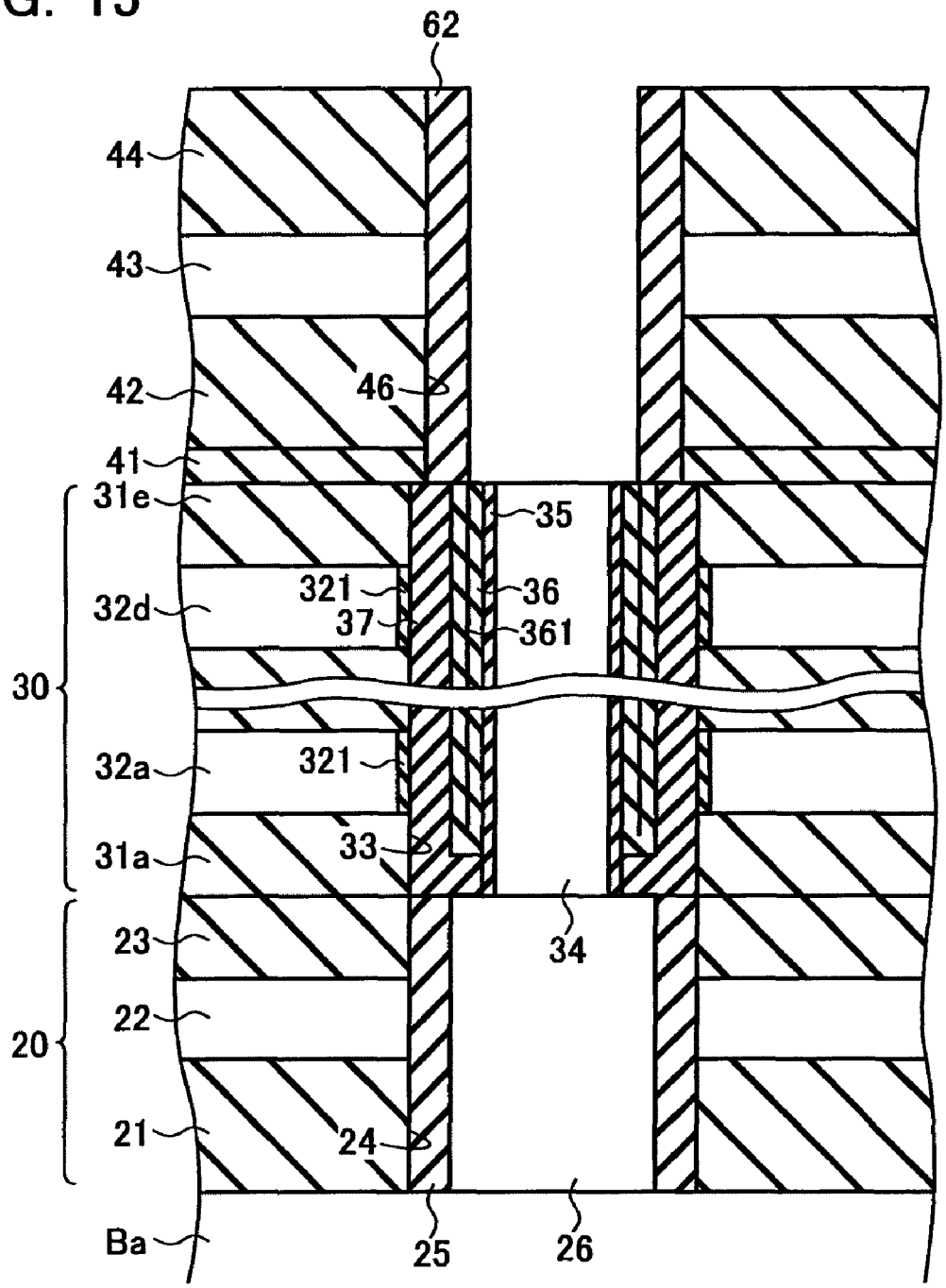
FIG. 15 is a cross-sectional view of one of the memory strings MS in the manufacturing process according to the second embodiment.

Then, a drain-side hole 46 is formed to penetrate the drain-side second insulation layer 44, the drain-side conductive layer 43, the drain-side first insulation layer 42, and the first isolation/insulation layer 41. Thereafter, a sacrificial layer 62 is formed on the side surface of the drain-side hole 46 and the resulting state is depicted in FIG. 15. Further, any natural oxide film is removed by hydrofluoric acid treatment that is formed on the top surface of the memory columnar semiconductor layer 34 exposed on the bottom surface of the drain-side hole 46. Note that the sacrificial layer 62 is formed by silicon germanium.

Figure 16:
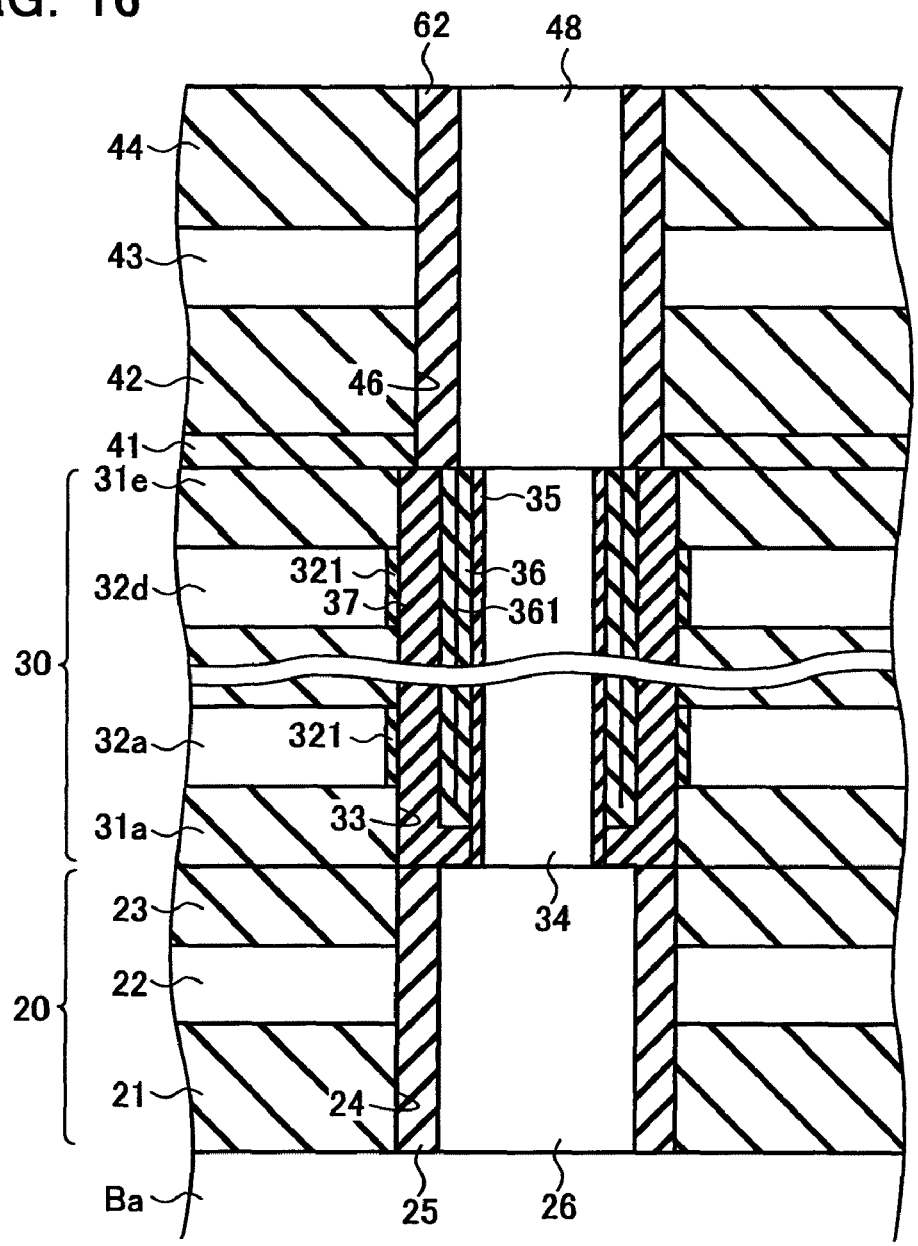
FIG. 16 is a cross-sectional view of one of the memory strings MS in the manufacturing process according to the second embodiment.

Then, as illustrated in FIG. 16, polysilicon is deposited in such a way that it comes in contact with the sacrificial layer 62 within the drain-side hole 46, thereby forming a drain-side columnar semiconductor layer 48. That is, in the process of FIGS. 15 and FIG. 16, the sacrificial layer 62 and the drain-side columnar semiconductor layer 48 are sequentially formed on the side surface of the drain-side hole 46.

Figure 17:
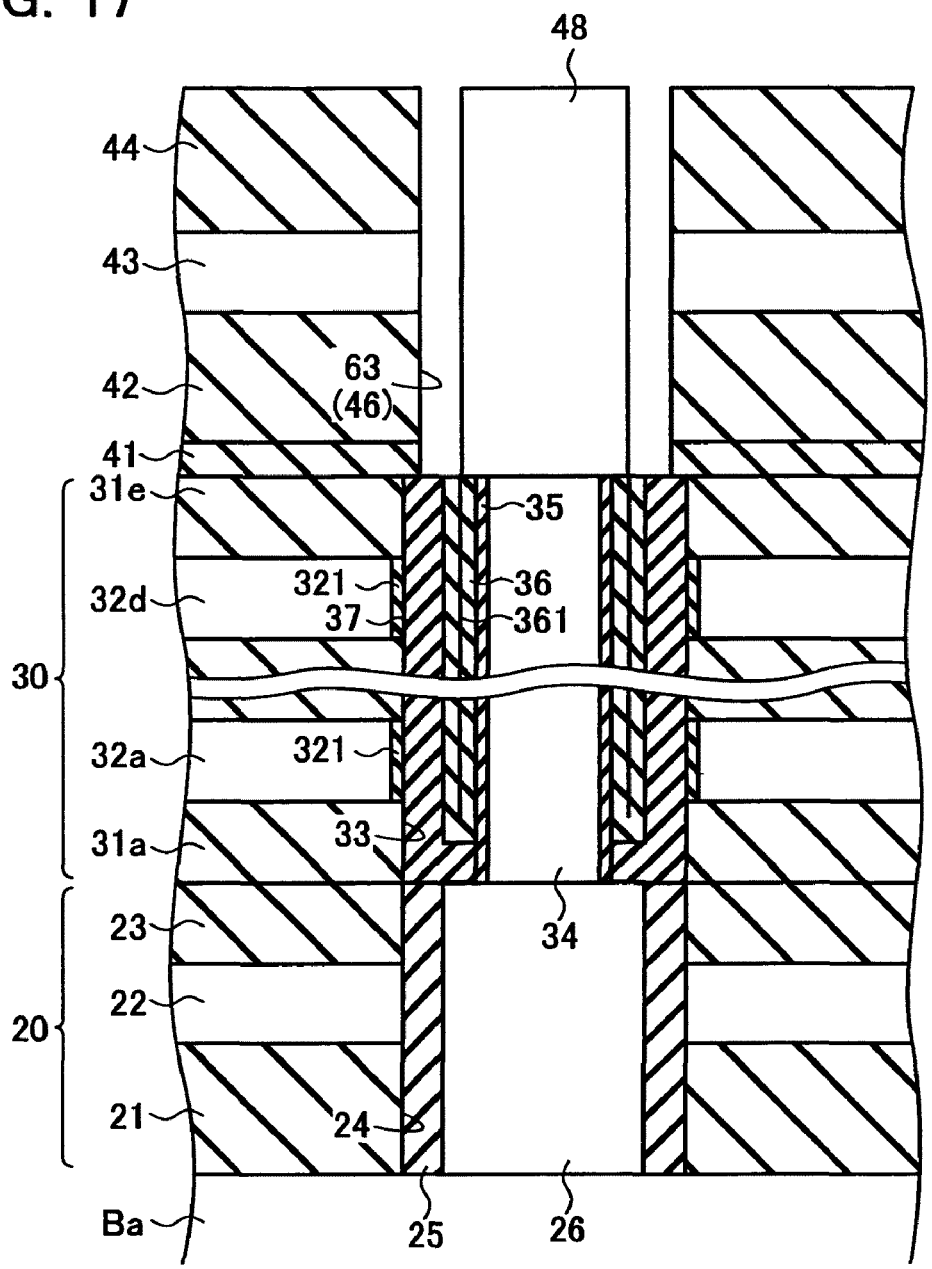
FIG. 17 is a cross-sectional view of one of the memory strings MS in the manufacturing process according to the second embodiment.

Then, as illustrated in FIG. 17, the sacrificial layer 62 is removed by selective etching to form a hollow cylindrical trench 63. Etching is performed in a $ClF_3$ vapor atmosphere, etc., since the sacrificial layer 62 is of silicon germanium.

Then, HTO is deposited within the trench 63 to form a drain-side gate insulation layer 61. At this moment, a seam 611 is formed in the drain-side gate insulation layer 61. Through this process, the above-mentioned state is obtained as depicted in FIG. 13.

(Advantages of Non-Volatile Semiconductor Storage Device in Second Embodiment)

The non-volatile semiconductor storage device according to the second embodiment has the charge accumulation layer 36, providing the same advantages as the first embodiment.

In addition, the non-volatile semiconductor storage device according to the second embodiment is manufactured through the step of forming the drain-side gate insulation layer 61 within the trench 63 formed between the drain-side columnar semiconductor layer 48 and each of the drain-side first insulation layer 42, the drain-side conductive layer 43, and the drain-side second insulation layer 44. Note that, through the above-mentioned step, the seam 611 is formed in the drain-side gate insulation layer 61.

Accordingly, hydrofluoric acid treatment is performed before forming the drain-side gate insulation layer 61. That is, the non-volatile semiconductor storage device according to the second embodiment can suppress degraded reliability problems, such as degradation in breakdown voltage, because it may form the drain-side gate insulation layer 61 with a preset, predetermined film thickness.

[Third Embodiment]

(Specific Configuration of Memory Strings MS in Third Embodiment)

Figure 18:
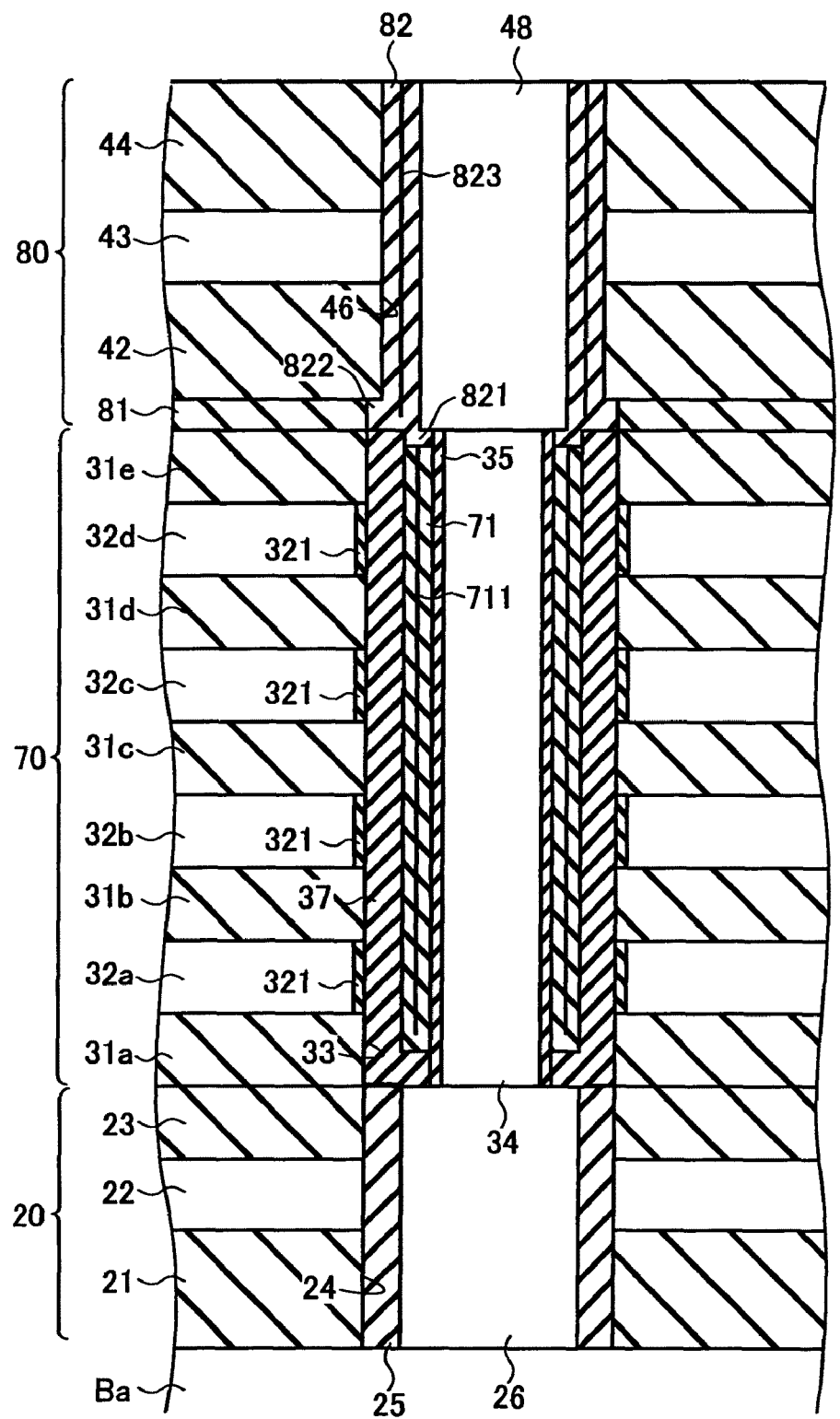
FIG. 18 is a diagram illustrating a cross-sectional structure of one of the memory strings MS according to a third embodiment.

Referring now to FIG. 18, a specific configuration of memory strings MS in a non-volatile semiconductor storage device according to a third embodiment of the present invention will be described below. As illustrated in FIG. 18, the memory strings MS according to the third embodiment has a memory transistor layer 70 and a drain-side selection transistor layer 80 different from the first and second embodiments. Note that the same reference numerals represent the same components as the first and second embodiments and description thereof will be omitted in the third embodiment.

The memory transistor layer 70 according to the third embodiment has a charge accumulation layer 71 with a different shape from that of the charge accumulation layer 36 according to the first and second embodiments. The top surface of the charge accumulation layer 71 is formed to be lower than the top surface of the fifth insulation layer between word lines 31e. In addition, the charge accumulation layer 71 has a seam 711 as with the first and second embodiments.

The drain-side selection transistor layer 80 according to the third embodiment has a first isolation and insulation layer 81 and a drain-side gate insulation layer 82 with different shapes from those of the first isolation/insulation layer 41 and the drain-side gate insulation layers 47, 62 according to the first and second embodiments, respectively.

One side surface of the first isolation and insulation layer 81 near the drain-side hole 46 is formed to be narrower than the side surfaces of the drain-side first insulation layer 42, the drain-side conductive layer 43, and the drain-side second insulation layer 44 that are formed by the drain-side hole 46.

The drain-side gate insulation layer 82 is formed to contact these "dimpled" charge accumulation layer 71 and first isolation and insulation layer 81. That is, the drain-side gate insulation layer 82 is formed in such a way that it comes in contact with the side surface of the tunnel insulation layer 35, the top surface of the charge accumulation layer 71, and the side and top surfaces of the block insulation layer 37. The drain-side gate insulation layer 82 has a first protruding portion 821 that protrudes from its bottom surface to contact the charge accumulation layer 71, and a second protruding portion 822 that protrudes from its lower side surface to contact the first isolation and insulation layer 81. In addition, the drain-side gate insulation layer 82 has a seam 823 from its upper end toward its lower end. The seam 823 is formed with a certain depth, not reaching the bottom of the drain-side gate insulation layer 82.

(Manufacturing Process of Memory Strings MS in Third Embodiment)

Figure 19:
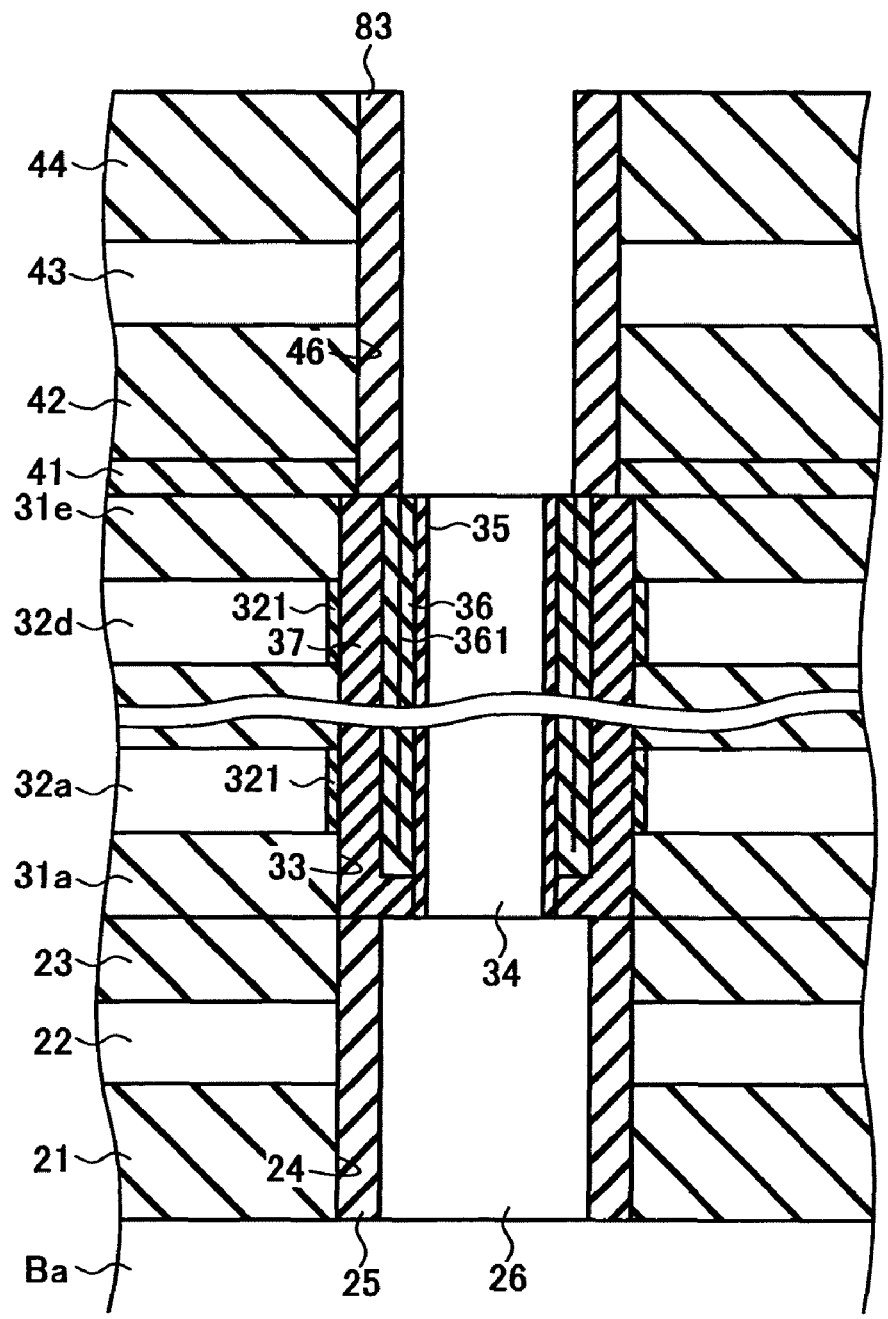
FIG. 19 is a cross-sectional view of one of the memory strings MS in a manufacturing process according to the third embodiment.
Figure 20:
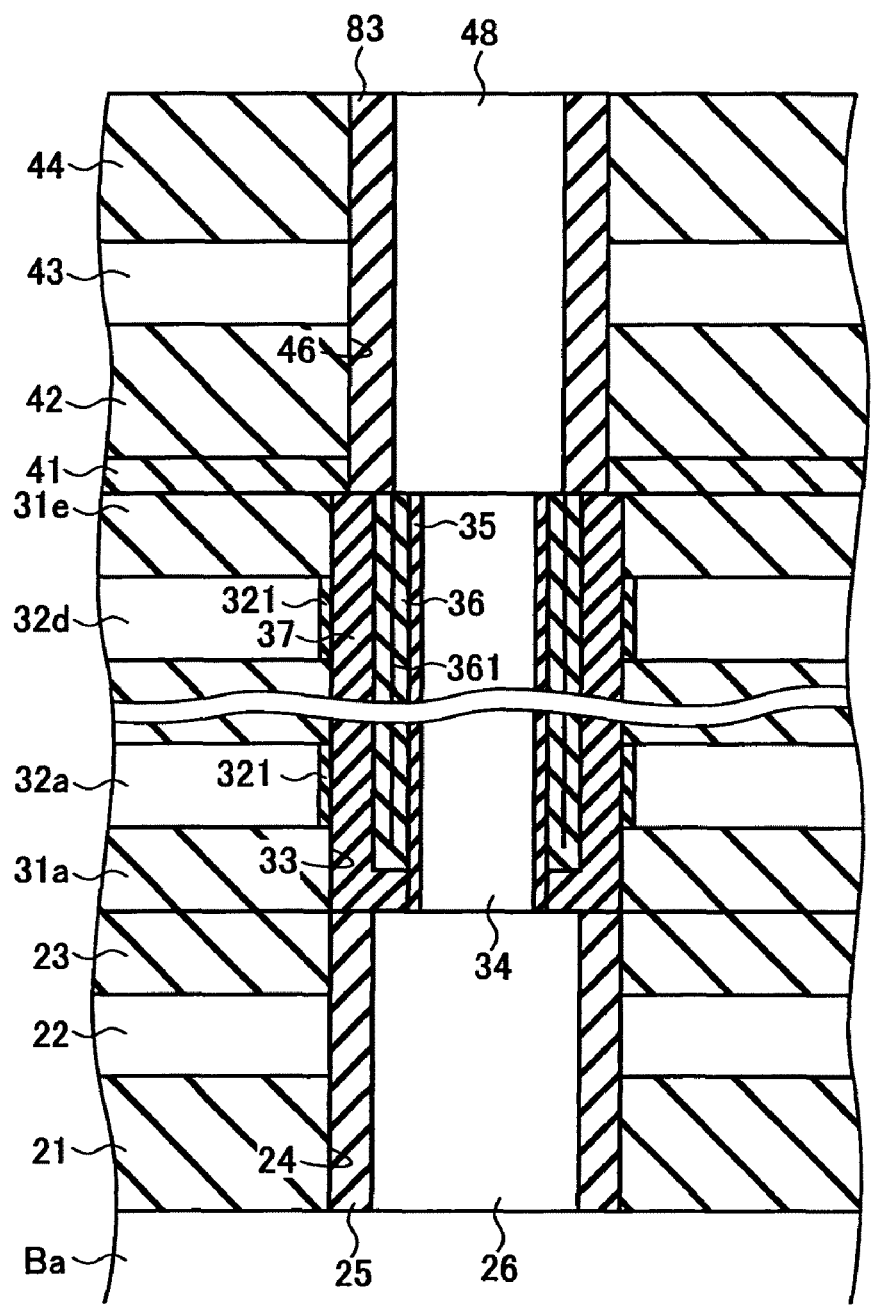
FIG. 20 is a cross-sectional view of one of the memory strings MS in the manufacturing process according to the third embodiment.
Figure 21:
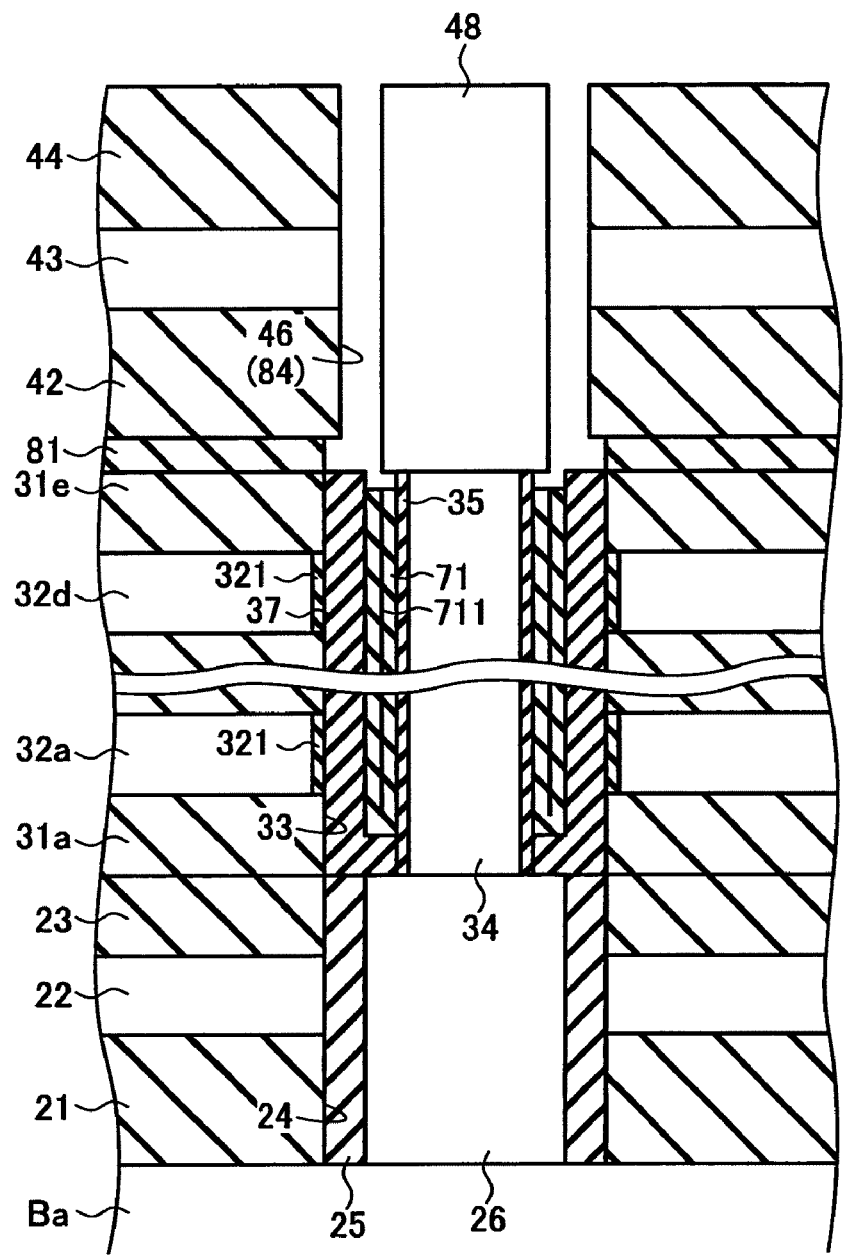
FIG. 21 is a cross-sectional view of one of the memory strings MS in the manufacturing process according to the third embodiment.
Figure 22:
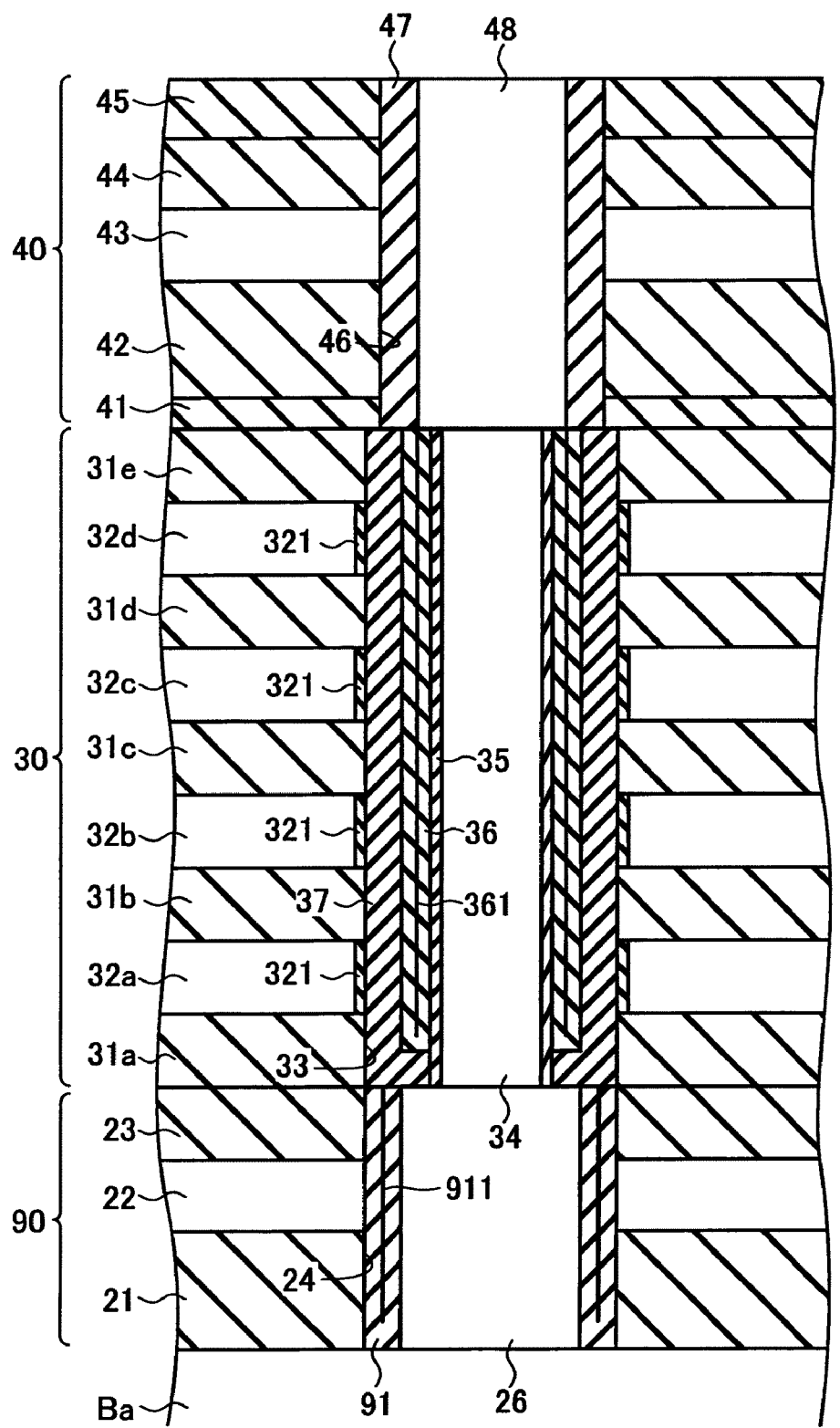
FIG. 22 is a diagram illustrating a cross-sectional structure of one of memory strings MS according to another embodiment.

Referring now to FIGS. 19 through 21, a manufacturing process of the memory strings MS according to the third embodiment will be described below. Note that some of the first to fifth insulation layers between word lines 31a to 31e and some of the first to fourth word-line conductive layers 32a to 32d are omitted from FIGS. 19 through 21.

Firstly, similar operations occur in the manufacturing process of the memory strings MS according to the third embodiment until that illustrated in FIG. 14 regarding the manufacturing process of the memory strings MS according to the second embodiment. Following the process of FIG. 14, as illustrated in FIG. 19, a sacrificial layer 83 is formed on the side surface in the drain-side hole 46. The sacrificial layer 83 is formed by silicon nitride.

Then, as illustrated in FIG. 20, polysilicon is deposited in such a way that it comes in contact with the sacrificial layer 83 within the drain-side hole 46, thereby forming a drain-side columnar semiconductor layer 48.

Then, as illustrated in FIG. 21, the sacrificial layer 83 is removed by selective etching to form a hollow cylindrical trench 84. At this moment, etching is performed by Hot phosphoric acid, etc., since the sacrificial layer 83 is formed by silicon nitride. That is, through the selective etching process of FIG. 21, the sacrificial layer 83 as well as those parts of the first isolation/insulation layer 41 and the charge accumulation layer 36 formed by silicon nitride are removed. The side surface of the first isolation/insulation layer 41 is partially removed to provide the shape of the first isolation and insulation layer 81 according to the third embodiment. In addition, the top surface of the charge accumulation layer 36 is partially removed to provide the shape of the charge accumulation layer 71 according to the third embodiment.

Following the process of FIG. 21, and then through the process similar to that illustrated in FIG. 17 in the second embodiment, the memory strings MS are obtained as illustrated in FIG. 18. That is, HTO is deposited within the trench 84 to form a drain-side gate insulation layer 82. At this moment, a seam 823 is formed in the drain-side gate insulation layer 82. In addition, the drain-side gate insulation layer 82 is formed in such a way that it comes in contact with the side surface of the tunnel insulation layer 35, the top surface of the charge accumulation layer 71, and the side and top surfaces of the block insulation layer 37.

According to the third embodiment, it may provide similar advantages to the first and second embodiments.

While embodiments of the present invention have been described with respect to a non-volatile semiconductor storage device, the present invention is not intended to be limited to the disclosed embodiments and various other changes, additions, replacements or the like may be made thereto without departing from the spirit of the invention. For example, in the above embodiments, although the trench 63 is formed at the drain-side selection transistor layer 60 using the sacrificial layer 62 before forming the drain-side gate insulation layer 61, a trench may also be formed at the source-side selection transistor layer 20 using a sacrificial layer before forming a source-side gate insulation layer. That is, as illustrated in FIG.

22, the non-volatile semiconductor storage device may have a source-side selection transistor layer 90 different from the first to third embodiments. The source-side selection transistor layer 90 has a source-side gate insulation layer 91 different from the first to third embodiments. The source-side gate insulation layer 91 has a seam from its upper end toward its lower end. The seam 911 is formed with a certain depth, not reaching the bottom of the source-side gate insulation layer 91.

Firstly, in the manufacturing process of the source-side selection transistor layer 90, the source-side first insulation layer 21, the source-side conductive layer 22, and the source-side second insulation layer 23 are laminated in order on the substrate Ba that is located below the place where the memory columnar semiconductor layer 34 is formed. Secondly, a source-side hole 24 is formed at a position matching the memory columnar semiconductor layer 34 to penetrate the source-side first insulation layer 21, the source-side conductive layer 22, and the source-side second insulation layer 23. Thirdly, a sacrificial layer and the source-side columnar semiconductor layer 26 are sequentially formed on the side surface of the source-side hole 24. Finally, the sacrificial layer is removed to form a trench, within which a source-side gate insulation layer 91 is formed.

What is claimed is:

1. A method of manufacturing a non-volatile semiconductor storage device having a plurality of memory strings with a plurality of electrically rewritable memory cells connected in series, the method comprising:
    alternately laminating first interlayer insulation layers and first conductive layers;
    forming a first hole penetrating the first interlayer insulation layers and the first conductive layers;
    sequentially forming a first insulation layer, a first sacrificial layer, and a first columnar semiconductor on the side surface of the first hole;
    removing the first sacrificial layer to form a first trench;
    forming a second insulation layer on the surface of the first columnar semiconductor exposed on the first trench; and
    forming a charge accumulation layer within the first trench, and the charge accumulation layer accumulating charges.

2. The method of manufacturing the non-volatile semiconductor storage device according to claim 1, wherein
    the first sacrificial layer is composed of silicon germanium.

3. The method of manufacturing the non-volatile semiconductor storage device according to claim 2, wherein
    in forming the first trench, the first sacrificial layer is etched in a $ClF_3$ vapor atmosphere.

4. The method of manufacturing the non-volatile semiconductor storage device according to claim 1, wherein
    the first sacrificial layer is composed of silicon nitride.

5. The method of manufacturing the non-volatile semiconductor storage device according to claim 4, wherein
    in forming the first trench, the first sacrificial layer is etched by Hot phosphoric acid.

6. The method of manufacturing the non-volatile semiconductor storage device according to claim 1, wherein
    in forming the second insulation layer, an oxidation layer is formed together with the second insulation layer on the sidewalls of the first conductive layers facing the first insulation layer.

7. The method of manufacturing the non-volatile semiconductor storage device according to claim 1, wherein
    the second insulation layer is formed using ISSG oxidation or ALD (atomic layer deposition).

8. The method of manufacturing the non-volatile semiconductor storage device according to claim 1, comprising:
    laminating, in order, a second interlayer insulation layer, a second conductor, and the second interlayer insulation layer on the top surface of the first columnar semiconductor or on a substrate located below the place where the first columnar semiconductor is formed;
    forming a second hole at a position matching the first columnar semiconductor penetrating the second interlayer insulation layer and the second conductor;
    sequentially forming a second sacrificial layer and a second columnar semiconductor on the side surface of the second hole;
    removing the second sacrificial layer to form a second trench; and
    forming a third insulation layer within the second trench.

9. The method of manufacturing the non-volatile semiconductor storage device according to claim 8, wherein
    the second interlayer insulation layer, the second conductor, and the second interlayer insulation layer are laminated in order on the top surface of the first columnar semiconductor,
    in forming the second trench, the upper portions of the charge accumulation layer are partially removed together with the second sacrificial layer, and
    in forming the third insulation layer, the third insulation layer is formed to contact the side surface of the second insulation layer, the top surface of the charge accumulation layer, and the side and top surfaces of the first insulation layer.

10. The method of manufacturing the non-volatile semiconductor storage device according to claim 8, wherein
    the second sacrificial layer is composed of silicon germanium.

11. The method of manufacturing the non-volatile semiconductor storage device according to claim 10, wherein
    in forming the second trench, the second sacrificial layer is etched in a $ClF_3$ vapor atmosphere.

12. The method of manufacturing the non-volatile semiconductor storage device according to claim 8, wherein
    the second sacrificial layer is composed of silicon nitride.

13. The method of manufacturing the non-volatile semiconductor storage device according to claim 12, wherein
    in forming the second trench, the second sacrificial layer is etched by Hot phosphoric acid.

* * * * *